US012367916B2

(12) United States Patent
Moon

(10) Patent No.: US 12,367,916 B2
(45) Date of Patent: Jul. 22, 2025

(54) ENCODERS, DECODERS, AND SEMICONDUCTOR MEMORY DEVICES INCLUDING THE SAME

(71) Applicant: Samsung Electronics Co., Ltd., Suwon-si (KR)

(72) Inventor: Byongmo Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 450 days.

(21) Appl. No.: 17/954,860

(22) Filed: Sep. 28, 2022

(65) Prior Publication Data

US 2023/0018451 A1 Jan. 19, 2023

Related U.S. Application Data

(62) Division of application No. 16/909,177, filed on Jun. 23, 2020, now Pat. No. 11,488,646.

(30) Foreign Application Priority Data

Nov. 13, 2019 (KR) .......... 10-2019-0144885

(51) Int. Cl.
*G11C 7/22* (2006.01)
*G11C 7/10* (2006.01)
*G11C 11/4074* (2006.01)
*G11C 11/408* (2006.01)

(52) U.S. Cl.
CPC .......... *G11C 7/222* (2013.01); *G11C 7/1039* (2013.01); *G11C 7/106* (2013.01); *G11C 7/1087* (2013.01); *G11C 7/1096* (2013.01); *G11C 11/4074* (2013.01); *G11C 11/4085* (2013.01)

(58) Field of Classification Search
CPC ....... G11C 7/222; G11C 7/1039; G11C 7/106; G11C 7/1087; G11C 7/1096; G11C 117/4074; G11C 11/4085
USPC .................................................... 365/185.03
See application file for complete search history.

(56) References Cited

U.S. PATENT DOCUMENTS

| 5,587,709 A | 12/1996 | Jeong |
| 5,877,635 A | 3/1999 | Lin |
| 6,275,084 B1 | 8/2001 | Mcadams |
| 7,589,362 B1 | 9/2009 | Argyres et al. |
| 7,982,493 B1 | 7/2011 | Kim |
| 8,674,999 B2 | 3/2014 | Hein |
| 9,137,070 B2 | 9/2015 | Beukema et al. |

(Continued)

FOREIGN PATENT DOCUMENTS

CN 103066987 A 4/2013

*Primary Examiner* — Connie C Yoha
(74) *Attorney, Agent, or Firm* — Myers Bigel, P.A.

(57) ABSTRACT

An encoder includes an encoding unit configured to receive 2n-bit read data and to generate 2m-bit read data, and an output driver configured to input m-bit first read data of the 2m-bit read data, to transmit voltage and/or current a first number of times corresponding to a number of first bits indicating a first state included in the m-bit first read data or to transmit current corresponding to the number of first bits during an activation period of a clock signal, and to transmit the voltage and/or the current a second number of times corresponding to a number of second bits indicating the first state included in m-bit second read data of the 2m-bit read data or to transmit current corresponding to the number of second bits during a deactivation period of the clock signal, wherein n is at least 2 and m is at least 3.

5 Claims, 11 Drawing Sheets

(56) References Cited

U.S. PATENT DOCUMENTS

| | | |
|---|---|---|
| 9,191,117 B2 | 11/2015 | Alexander et al. |
| 2003/0016770 A1 | 1/2003 | Trans et al. |
| 2007/0097826 A1 | 5/2007 | Iimura et al. |
| 2011/0238902 A1* | 9/2011 | Ishikawa .................. G11C 8/10 711/E12.008 |
| 2013/0099823 A1 | 4/2013 | Moon et al. |
| 2015/0023112 A1 | 1/2015 | Eom et al. |
| 2019/0332279 A1 | 10/2019 | Hollis et al. |
| 2021/0225426 A1 | 7/2021 | Moon et al. |
| 2021/0303391 A1* | 9/2021 | Lee .................... G06F 11/0793 |
| 2023/0072387 A1* | 3/2023 | Shimizu ................ G11C 16/24 |

* cited by examiner

ENCODERS, DECODERS, AND SEMICONDUCTOR MEMORY DEVICES INCLUDING THE SAME

CROSS-REFERENCE TO RELATED APPLICATIONS

This patent application is a divisional of U.S. patent Ser. No. 16/909,177, filed Jun. 23, 2020, which claims the benefit under 35 U.S.C. § 119(a) of Korean Patent Application No. 10-2019-0144885, filed on Nov. 13, 2019, in the Korean Intellectual Property Office, and the entire contents of each above-identified application are incorporated by reference herein.

FIELD

Example embodiments according to the inventive concepts relate to encoders, decoders, and semiconductor memory devices including the same.

BACKGROUND

In general, a data transmission and reception system includes a transmission device and a reception device, the transmission device includes an output driver to transmit data to the reception device, and the reception device includes an input driver to receive data.

However, as the data transmission and reception systems have transitioned to higher speed devices with lower power consumption, a frequency of a clock signal transmitted between the transmission device and the reception device has also increased and the data swing has also been reduced. Thus, it has become more difficult to transmit many bits of data at a higher speed using a typical output driver and input driver.

SUMMARY

The example embodiments of the inventive concepts are directed to encoders, decoders, and semiconductor memory devices including the same for transmitting data between a transmission device and a reception device at high speed.

The technical problems solved by the example embodiments are not limited to the above technical problems and other technical problems which are not described herein will become apparent to those skilled in the art from the following description.

According to an example embodiment of the inventive concepts, an encoder includes: an encoding unit configured to receive 2n-bit read data and to generate 2m-bit read data; and an output driver configured to input m-bit first read data of the 2m-bit read data, to transmit voltage and/or current a first number of times corresponding to a number of first bits indicating a first state that are included in the m-bit first read data or to transmit current corresponding to the number of first bits during an activation period of a clock signal, and to transmit the voltage and/or the current by a second number of times corresponding to a number of second bits indicating the first state that are included in m-bit second read data of the 2m-bit read data or to transmit current corresponding to the number of second bits during a deactivation period of the clock signal, wherein n is at least 2 and m is at least 3.

According to an example embodiment of the inventive concepts, a decoder includes: an input driver configured to detect a level of voltage and/or current received during an activation period of a clock signal to output a first write level and to detect a level of the voltage and/or the current received during a deactivation period of the clock signal to output a second write level; and a decoding unit configured to generate n-bit first write data of 2n-bit write data using the first write level and to generate n-bit second write data of the 2n-bit write data using the second write level, wherein each of the first write level and the second write level is one of at least three different levels and n is at least 2.

According to an example embodiment of the inventive concepts, a semiconductor memory device includes: a row decoder configured to generate a plurality of word line selection signals in response to a row address; a column decoder configured to generate a plurality of column selection signals in response to a column address; a memory cell array comprising a plurality of memory cells, and configured to generate multi-bit read data from selected memory cells among the plurality of memory cells in response to the plurality of word line selection signals and the plurality of column selection signals and/or to store multi-bit write data from the selected memory cells; a read path unit configured to receive the multi-bit read data and to generate 2n-bit read data during a read operation; and an encoder configured to receive the 2n-bit read data to generate 2m-bit read data during the read operation, to transmit current and/or voltage a first number of times corresponding to a number of first bits indicating a first state that are included in m-bit first read data of the 2m-bit read data or to transmit current corresponding to the number of first bits during an activation period of a clock signal, and to transmit the current and/or the voltage a second number of times corresponding to a number of second bits indicating the first state that are included in m-bit second read data of the 2m-bit read data or to transmit current corresponding to the number of second bits during a deactivation period of the clock signal, wherein n is at least 2 and m is at least 3.

DETAILED DESCRIPTION

Hereinafter, an encoder, a decoder, and a semiconductor memory device including the same according to example embodiments of the inventive concepts will be described with reference the accompanying drawings.

Figure 1:
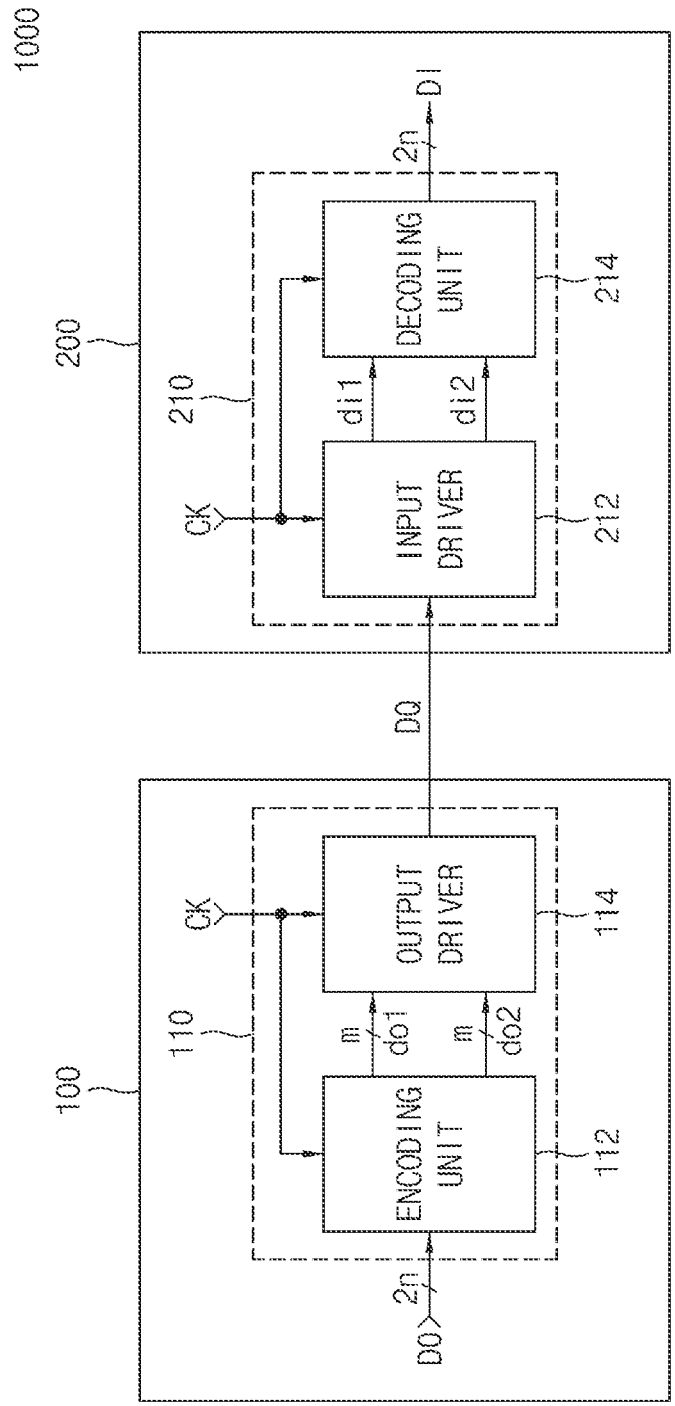
FIG. 1 is a block diagram showing the configuration of a data transmission and reception system according to an example embodiment of the inventive concepts.

FIG. 1 is a block diagram showing the configuration of a data transmission and reception system 1000 according to an example embodiment of the inventive concepts. The data transmission and reception system 1000 may include a data transmission device 100 and a data reception device 200.

Referring to FIG. 1, the data transmission device 100 may include an encoder 110, and the encoder 110 may include an encoding unit 112 and an output driver 114. The data reception device 200 may include a decoder 210, and the decoder 210 may include an input driver 212 and a decoding unit 214.

Respective functions of the blocks illustrated in FIG. 1 will be described below.

The encoder 110 may encode 2n-bit read data DO generated in the data transmission device 100 to convert the 2n-bit read data DO into 2m-bit read data in response to a clock signal CK, may transmit m-bit first read data (e.g., upper m-bit read data) do1 of the 2m-bit read data as data DQ during an activation period of the clock signal CK, and may transmit m-bit second read data (e.g., lower m-bit read data) do2 of the 2m-bit read data as data DQ during a deactivation period of the clock signal CK. Here, m may be greater than n, n is equal to or greater than 2, and m may be equal to or greater than 3. It will be understood that, although the terms first, second, third, etc. may be used herein to describe various elements, the elements should not be limited by these terms; rather, these terms are only used to distinguish one element from another element. Thus, a first element discussed could be termed a second element without departing from the scope of the present inventive concepts.

The encoding unit 112 may encode n-bit first read data (e.g., upper n-bit read data) of the 2n-bit read data DO to generate the m-bit first read data do1 in response to the clock signal CK, and may encode n-bit second read data (e.g., lower n-bit read data) of the 2n-bit read data DO to generate the m-bit second read data do2.

The output driver 114 may transmit voltage and/or current a number of times corresponding to the number of first bits indicating a first state (e.g., "high" level or "1") included in m-bit first read data or may transmit current corresponding to the number of first bits during the activation period of the clock signal CK. The output driver 114 may transmit voltage and/or current a number of times corresponding to the number of second bits indicating the first state included in the m-bit second read data or may transmit current corresponding to the number of second bits during the deactivation period of the clock signal CK. The output driver 114 may transmit the same voltage level and/or the same current level the number of times corresponding to the number of first bits and/or the number of second bits, and/or may transmit one current level corresponding to the number of first bits and/or the number of second bits among m different current levels.

The decoder 210 may receive the data DQ, may detect a level of the data DQ (e.g., m-bit first read data) received during the activation period of the clock signal CK to generate a first write level di1, may detect a level of the data DQ (e.g., m-bit second read data) received during the deactivation period of the clock signal CK to generate a second write level di2, may decode the first write level di1 to generate n-bit first write data (e.g., upper n-bit write data) of the 2n-bit write data, and may decode the second write level di2 to generate n-bit second write data (e.g., lower n-bit write data) of the 2n-bit write data. Here, the first write level di1 and the second write level di2 may each be one of at least m different levels.

The input driver 212 may accumulate voltage and/or current of the m-bit first read data received during the activation period of the clock signal CK to generate the first write level di1, and may accumulate voltage and/or current of the m-bit second read data received during the deactivation period of the clock signal CK to generate the second write level di2.

The decoding unit 214 may decode the first write level di1 to generate n-bit first write data (e.g., upper n-bit write data) of the 2n-bit write data during the activation period of the clock signal CK, and may decode the second write level di2 to generate n-bit second write data (e.g., lower n-bit write data) of the 2n-bit write data during the deactivation period of the clock signal CK.

In FIG. 1, the clock signals CK provided to the encoder 110 and the decoder 210 may be the same clock signal or synchronized clock signals.

Figure 2:
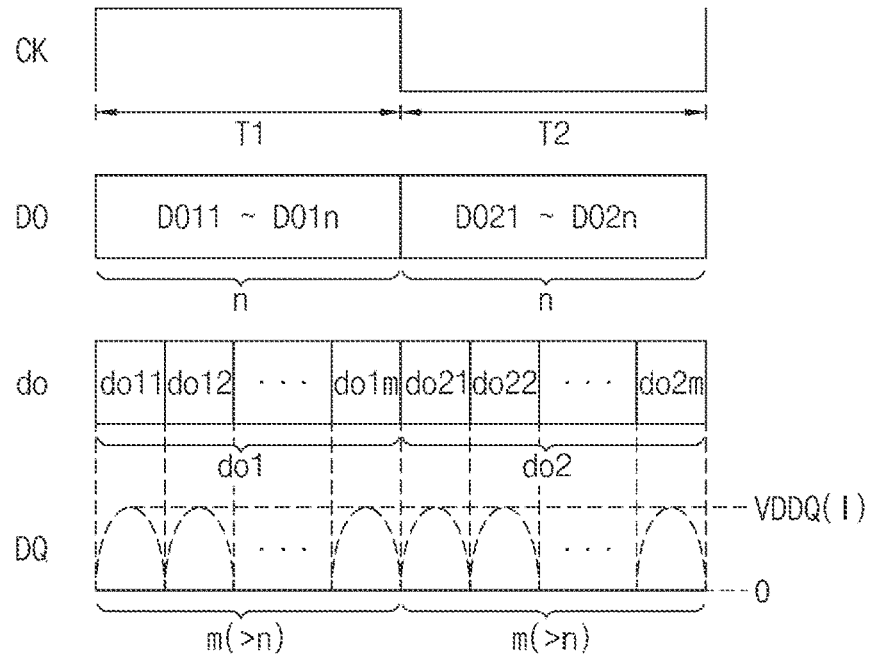
FIGS. 2 and 3 are diagrams explaining an operation of an encoder according to an example embodiment of the inventive concepts, respectively.

FIG. 2 is a diagram explaining an operation of the encoder 110 according to an example embodiment of the inventive concepts.

Referring to FIGS. 1 and 2, the encoding unit 112 may encode n-bit first read data DO11 to DO1$n$ and n-bit second read data DO21 to DO2$n$ to generate m-bit first read data do11 to do1$m$ and m-bit second read data do21 to do2$m$, respectively.

The output driver 114 may sequentially transmit voltage and/or current corresponding to each bit of the m-bit first read data do11 to do1$m$ as the data DQ during an activation period T1 of the clock signal CK. For example, when a bit do11 of the m-bit first read data do11 to do1$m$ is a first state (e.g., "high" level or "1"), the output driver 114 may transmit a power voltage VDDQ and/or current I, and when the bit do11 is a second state (e.g., "low" level or "0"), the output driver 114 may not transmit the power voltage VDDQ or the current I or may be connected to ground voltage. Similarly, the output driver 114 may sequentially transmit voltage and/or current corresponding to each bit of the m-bit second read data do21 to do2$m$ as the data DQ during a deactivation period T2 of the clock signal CK. For example, when a bit do21 of the m-bit second read data do21 to do2$m$ is the first state (e.g., "high" level or "1"), the output driver 114 may transmit the power voltage VDDQ and/or the current I, and when the bit do21 is the second state (e.g., "low" level or "0"), the output driver 114 may not transmit the power voltage VDDQ or the current I or may be connected to ground voltage. That is, when the number of first bits indicating the first state among the m-bit first read data do11 to do1$m$ is k during the activation period T1 of the clock signal CK, the output driver 114 may transmit the power voltage VDDQ and/or the current I k times, and when the number of second bits indicating the first state among the m-bit second read data do21 to do2$m$ is j during the deactivation period T2 of the clock signal CK, the output driver 114 may transmit the power voltage VDDQ and/or the current I j times. The values k and j may each be at least 0 and at most m. The power voltage VDDQ and/or the current I may be transmitted in a pulse form. The power voltage VDDQ may be equal to or less than 50 mV and the current may be equal to or less than 1 mA.

Figure 3:
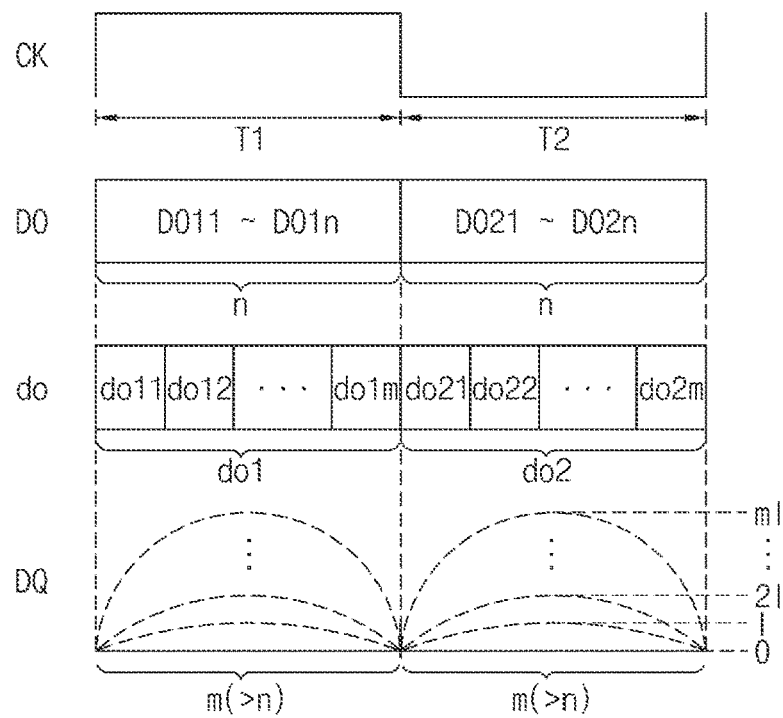

FIG. 3 is a diagram explaining an operation of the encoder 110 according to an example embodiment of the inventive concepts.

Referring to FIGS. 1 and 3, the encoding unit 112 may encode the n-bit first read data DO11 to DO1$n$ and the n-bit second read data DO21 to DO2$n$ to generate the m-bit first read data do11 to do1$m$ and the m-bit second read data do21 to do2$m$, respectively.

The output driver 114 may transmit current corresponding to the number of first bits indicating the first state among the m-bit first read data do11 to do1$m$ among m currents I, 2I, . . . , mI during the activation period T1 of the clock signal CK, and may transmit current corresponding to the number of second bits indicating the first state among the m-bit second read data do21 to do2$m$ among the m currents I, 2I, . . . , mI during the deactivation period T2 of the clock signal CK. The m currents I, 2I, . . . , mI may represent different current levels (e.g., magnitudes) for the transmitted current. In some embodiments, a current level of 2I may be a current level (e.g., magnitude) that is twice that of current level I and a current level of 3I may be three times that of current level I, but the inventive concepts are not limited thereto. In some embodiments, the different current levels I, 2I, . . . , mI may have levels that increase non-linearly. For example, in some embodiments, 2I may be a second current level, but not necessarily two times the current level I. For example, when the number of first bits indicating the first state among the m-bit first read data do11 to do1$m$ is 3 during the activation period T1 of the clock signal CK, the output driver 114 may transmit current 3I, and when the number of first bits is m, the output driver 114 may transmit current mI. Similarly, when the number of second bits indicating the first state among the m-bit second read data do21 to do2$m$ is 1 during the deactivation period T2 of the clock signal CK, the output driver 114 may transmit the current I, and when the number of second bits is 2, the output driver 114 may transmit current 2I. When the number of first or second bits corresponding to the first state among the m-bit first read data do11 to do1$m$ or the m-bit second read data do21 to do2$m$ is 0, the output driver 114 may not transmit current or may connect to ground voltage.

That is, when the number of first bits indicating the first state among the m-bit first read data do11 to do1$m$ is k during the activation period T1 of the clock signal CK, the output driver 114 may transmit current corresponding to k (e.g., a $k^{th}$ current level), and when the number of second bits indicating the first data among the m-bit second read data do21 to do2$m$ is j during the deactivation period T2 of the clock signal CK, the output driver 114 may transmit current corresponding to j (e.g., a $j^{th}$ current level).

Figure 4:
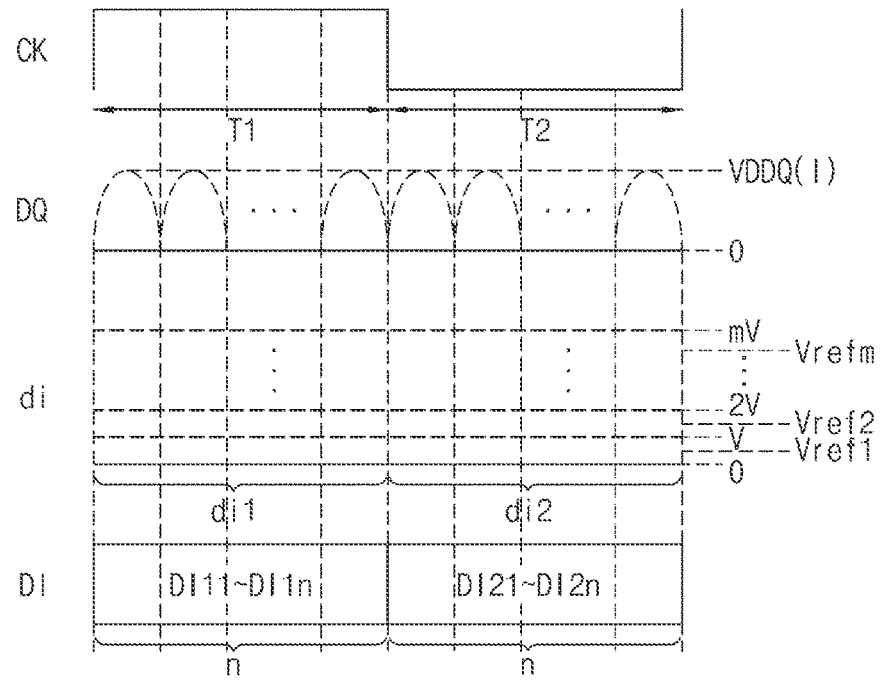
FIGS. 4 and 5 are diagrams explaining an operation of a decoder according to an example embodiment of the inventive concepts, respectively.

FIG. 4 is a diagram for explaining an operation of the decoder 210 according to an example embodiment of the inventive concepts.

Referring to FIGS. 1 and 4, the input driver 212 may detect a voltage level generated by accumulating the power voltage VDDQ and/or the current I of the data DQ received during the activation period T1 of the clock signal CK to generate the first write level di1, and may also detect a level generated by accumulating the power voltage VDDQ and/or the current I of the data DQ during the deactivation period T2 of the clock signal CK to generate the second write level di2. For example, each of the first write level di1 and the second write level di2 may be one voltage among at least m different voltages V, 2V, . . . , mV.

The decoding unit 214 may decode the first write level di1 to generate n-bit first write data during the activation period T1 of the clock signal CK, and may decode the second write level di2 to generate n-bit second write data during the deactivation period T2 of the clock signal CK. For example, the decoding unit 214 may compare each of the first write level di1 and the second write level di2 with m reference voltages Vref1 to Vrefm to generate n-bit first write data DI11 to DI1$n$ and n-bit second write data DI21 to DI2$n$.

Figure 5:
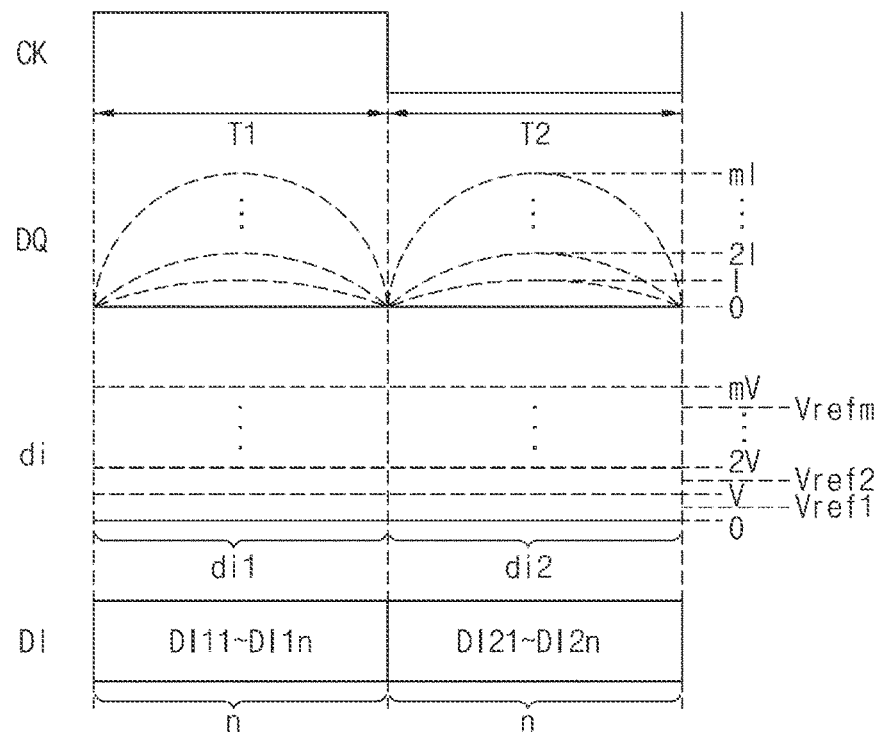

FIG. 5 is a diagram explaining an operation of the decoder 210 according to an example embodiment of the inventive concepts.

Referring to FIGS. 1 and 5, the input driver 212 may detect a level generated by accumulating current (one level of I, 2I, . . . , mI) of the data DQ received during the activation period of the clock signal CK to generate the first write level di1, and may detect a level generated by accumulating current (one level of I, 2I, . . . , mI) of the data DQ received during the deactivation period of the clock signal CK to generate the second write level di2. For example, each of the first write level di1 and the second write level di2 may be one voltage of m voltages V, 2V, . . . , mV corresponding to a level of current of the data DQ.

An operation of the decoding unit 214 may be understood with reference to the description of FIG. 4 described above.

Figure 6:
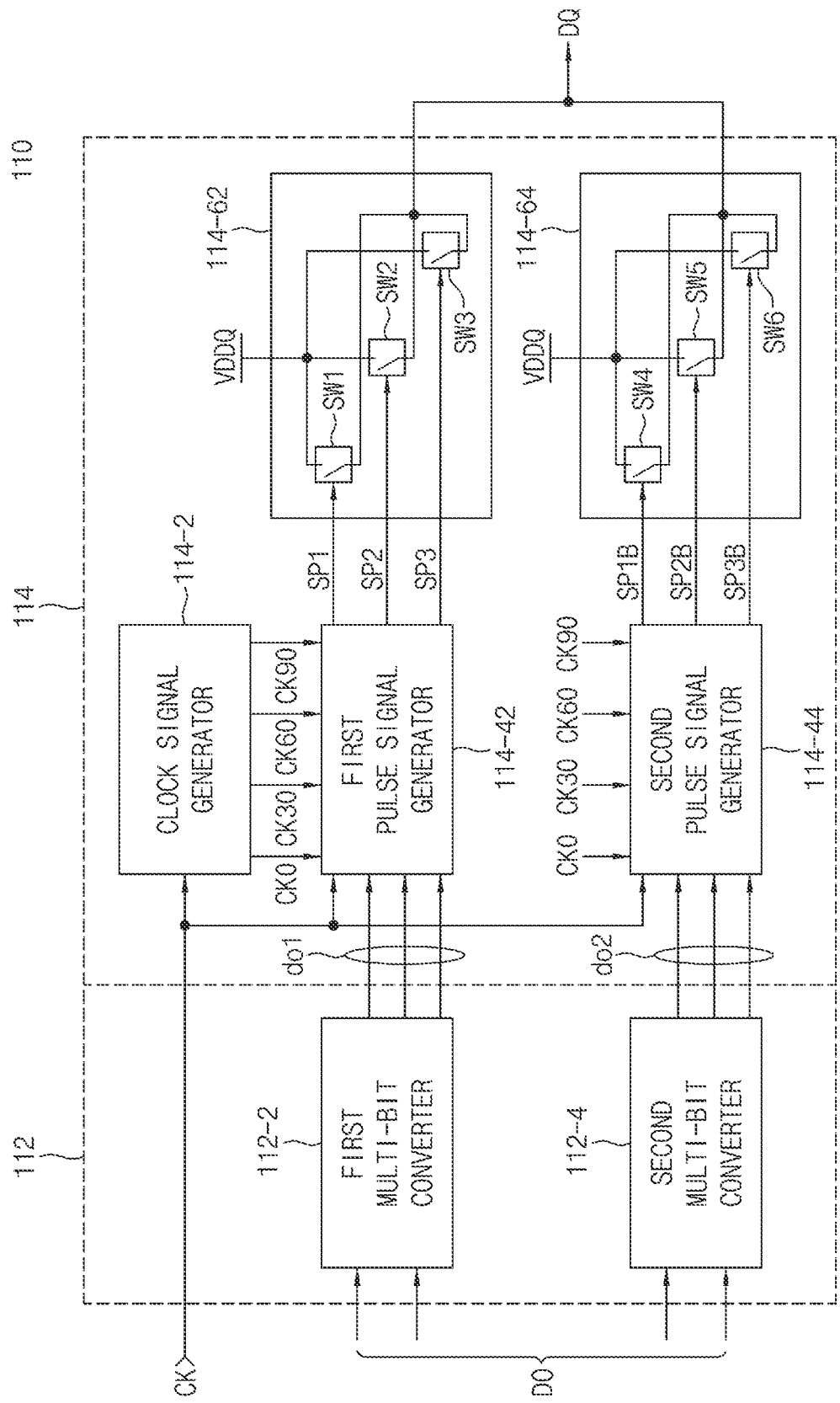
FIG. 6 is a block diagram illustrating a configuration of an encoder according to an example embodiment of the inventive concepts.

FIG. 6 is a block diagram illustrating a configuration of the encoder 110 according to an example embodiment of the inventive concepts. The encoding unit 112 may include first and second multi-bit converters 112-2 and 112-4, and the output driver 114 may include a clock signal generator 114-2, first and second pulse signal generators 114-42 and 114-44, and first and second drivers 114-62 and 114-64.

Respective functions of the blocks illustrated in FIG. 6 will be described below.

The first multi-bit converter 112-2 may encode 2-bit first read data of 4-bit read data DO to generate 3-bit first read data do1. FIG. 6 and the following figures illustrate example embodiments in which n is 2 and m is 3, but this is merely an example to aid in explanation, and the present inventive concepts are not limited thereto.

The second multi-bit converter 112-4 may encode 2-bit second read data of the 4-bit read data DO to generate 3-bit second read data do2.

For example, each of the first multi-bit converter 112-2 and the second multi-bit converter 112-4 may encode "00", "01", "10", and "11" to generate "000", "001", "110", and "111", respectively. In some embodiments, the conversion performed by the first multi-bit converter 112-2 and the second multi-bit converter 112-4 may allow the n-bit first and second read data to be uniquely represented in m bits, respectively. For example, the m bits may be selected to include sufficient values such that there exists a value having a unique number of bits of the first state (e.g., "high" level or "1") for each of the possible values of the n-bit first and/or second read data.

The clock signal generator 114-2 may receive the clock signal CK to generate four clock signals CK0, CK30, CK60, and CK90, of which two adjacent clock signals have a phase difference of 30 degrees.

The first pulse signal generator 114-42 may sequentially generate three first clock signals using the four clock signals CK0, CK30, CK60, and CK90 during the activation period of the clock signal CK, and may sequentially generate the three first clock signals as the three first pulse signals SP1, SP2, and SP3 based on the 3-bit first read data do1.

The second pulse signal generator 114-44 may sequentially generate three second clock signals using the four clock signals CK0, CK30, CK60, and CK90 during the deactivation period of the clock signal CK, and may sequentially activate three second pulse signals SP1B, SP2B, and SP3B using the three second clock signals based on the 3-bit second read data do2.

That is, when each bit of the 3-bit first read data do1 and the 3-bit second read data do2 is a first state, the first and second pulse signal generators 114-42 and 114-44 may generate a corresponding clock signal as a corresponding pulse signal, and when each bit of the 3-bit first read data do1 and the 3-bit second read data do2 is a second state, the first and second pulse signal generators 114-42 and 114-44 may not generate a corresponding pulse signal.

The first driver 114-62 may include first to third switches SW1 to SW3, the first to third switches SW1 to SW3 may be turned on in response to three first pulse signals SP1, SP2, and SP3, respectively, to transmit the power voltage VDDQ as the data DQ, and may be turned off in response to the three first pulse signals SP1, SP2, and SP3, respectively, not to transmit voltage. Although not shown, the first driver 114-62 may be connected to ground voltage in response to each of the three first pulse signals SP1, SP2, and SP3.

The second driver 114-64 may include fourth to sixth switches SW4 to SW6, the fourth to sixth switches SW4 to SW6 may be turned on in response to three second pulse signals SP1B, SP2B, and SP3B, respectively, to transmit the power voltage VDDQ as the data DQ, and may be turned off in response to the three second pulse signals SP1B, SP2B, and SP3B, respectively, not to transmit voltage. Although not shown, the second driver 114-64 may be connected to ground voltage in response to each of the three second pulse signals SP1B, SP2B, and SP3B.

Referring to FIGS. 1, 2, and 6, the first driver 114-62 may sequentially transmit power voltage VDDQ at most 3 times in response to three first pulse signals SP1, SP2, and SP3 during the activation period of the clock signal CK, and the second driver 114-64 may sequentially transmit the power voltage VDDQ at most 3 times in response to three second pulse signals SP1B, SP2B, and SP3B during the deactivation period of the clock signal CK. Each of the first and second drivers 114-62 and 114-64 may not transmit the power voltage VDDQ or may connect to ground voltage when the first pulse signals SP1, SP2, and SP3 and the second pulse signals SP1B, SP2B, and SP3B are not activated.

Figure 7:
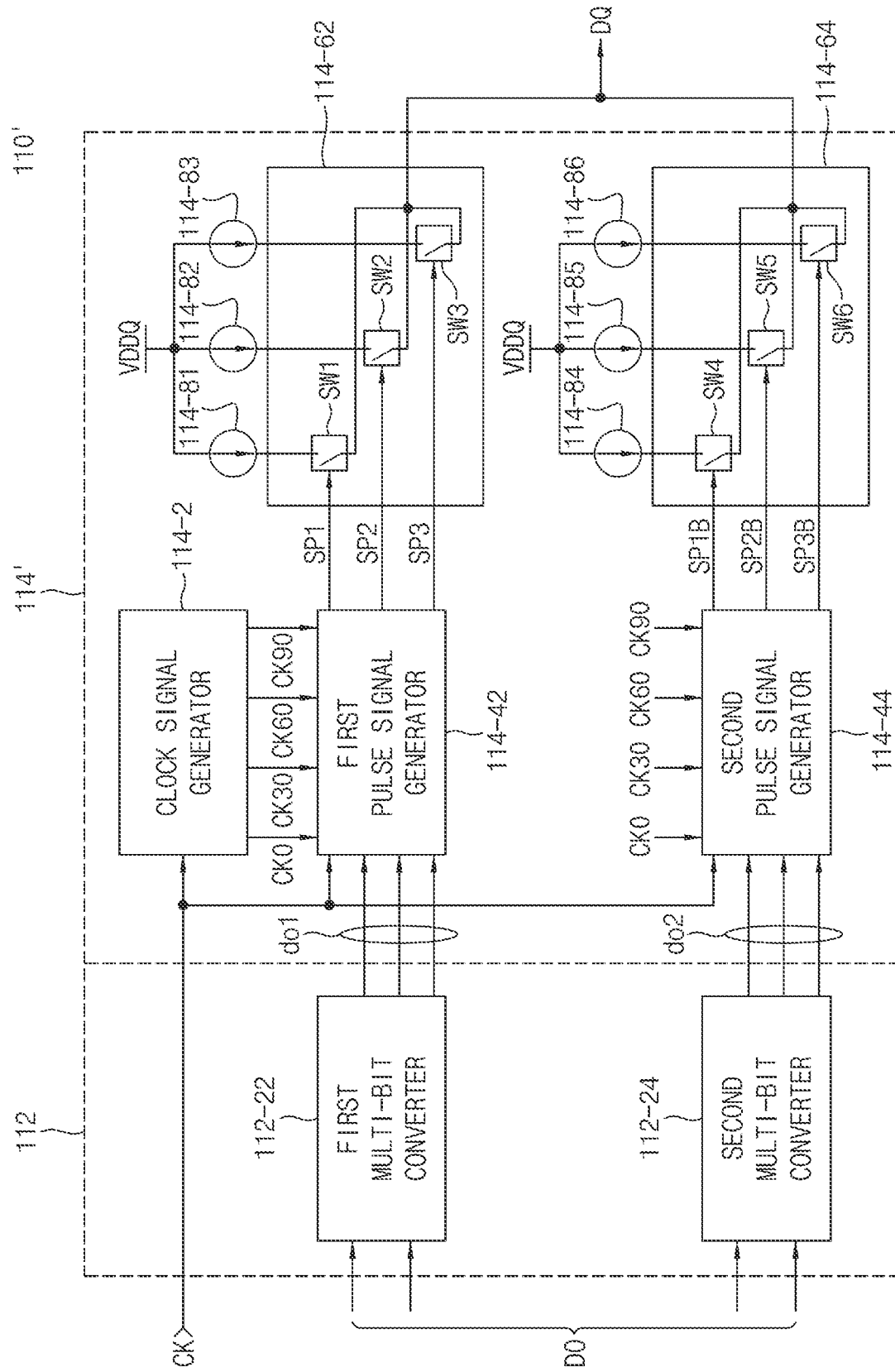
FIG. 7 is a block diagram showing the configuration of an encoder according to an example embodiment of the inventive concepts.

FIG. 7 is a block diagram showing the configuration of an encoder 110' according to an example embodiment of the inventive concepts. The encoding unit 112 may have the same configuration as the encoding unit 112 shown in FIG. 6, and an output driver 114' may further include constant current sources 114-81 to 114-86 in addition to the output driver 114 illustrated in FIG. 6.

Respective functions of the blocks illustrated in FIG. 7 will be described below.

Blocks illustrated in FIG. 7 having the same reference numerals as those of the blocks illustrated in FIG. 6 may be easily understood with reference to the description of FIG. 6, and here, only functions of constant current sources 114-81 to 114-86 and the first and second drivers 114-62 and 114-64 will be described.

Each of the constant current sources 114-81 to 114-86 may generate the current I.

The first driver 114-62 may include the first to third switches SW1 to SW3, and the first to third switches SW1 to SW3 may be turned on in response to the three first pulse signals SP1, SP2, and SP3, respectively, to transmit the current I flowing through each of the constant current sources 114-61 to 114-63 as the data DQ, and may be turned off in response to the three first pulse signals SP1, SP2, and SP3, respectively, not to transmit a current. Although not shown, the first driver 114-62 may be connected to ground voltage in response to each of the three first pulse signals SP1, SP2, and SP3.

The second driver 114-64 may include the fourth to sixth switches SW4 to SW6, and the fourth to sixth switches SW4 to SW6 may be turned in response to the three second pulse signals SP1B, SP2B, and SP3B, respectively, to transmit the current I flowing through each of constant current sources 114-64 to 114-66 as the data DQ and may be turned off in response to the three second pulse signals SP1B, SP2B, and SP3B, respectively, not transmit current. Although not shown, the second driver 114-64 may be connected to ground voltage in response to the three second pulse signals SP1B, SP2B, and SP3B, respectively.

Referring to FIGS. 1, 2, and 7, the first driver 114-62 may sequentially transmit the current I at most 3 times in response to the three first pulse signals SP1, SP2, and SP3 during the activation period of the clock signal CK, and the second driver 114-64 may sequentially transmit the current I at most 3 times in response to three second pulse signals SP1B, SP2B, and SP3B during the deactivation period of the clock signal CK. Each of the first and second drivers 114-62 and 114-64 may not transmit the current I or may be connected to ground voltage when the first pulse signals SP1, SP2, and SP3 and the second pulse signals SP1B, SP2B, and SP3B are not activated.

Figure 8:
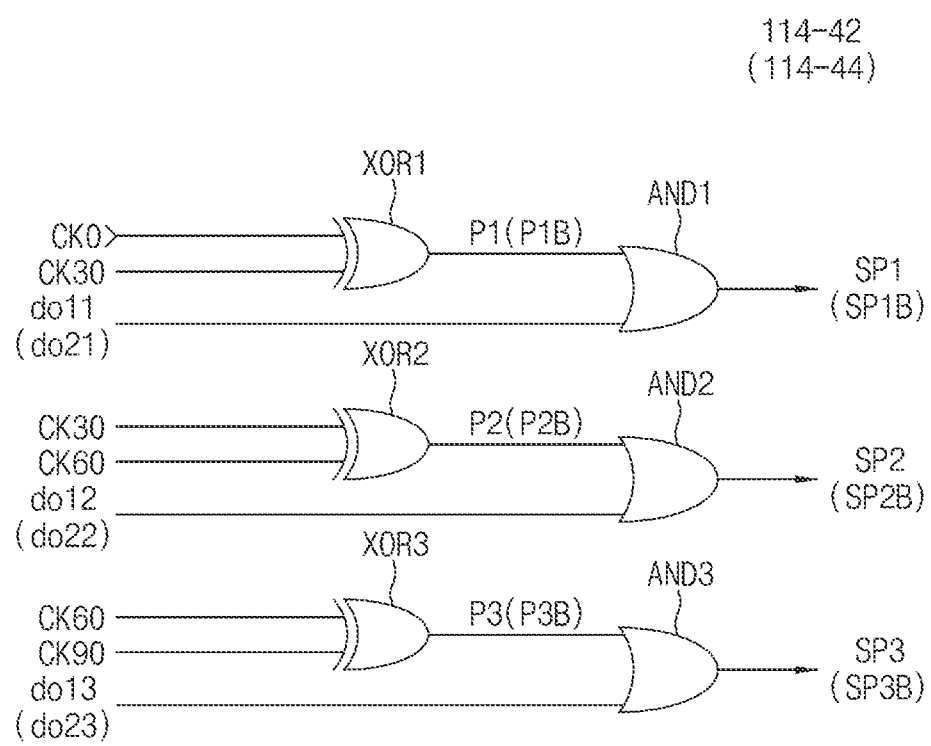
FIG. 8 is a diagram showing the configuration of first and second pulse signal generators according to an example embodiment of the inventive concepts.
Figure 9:
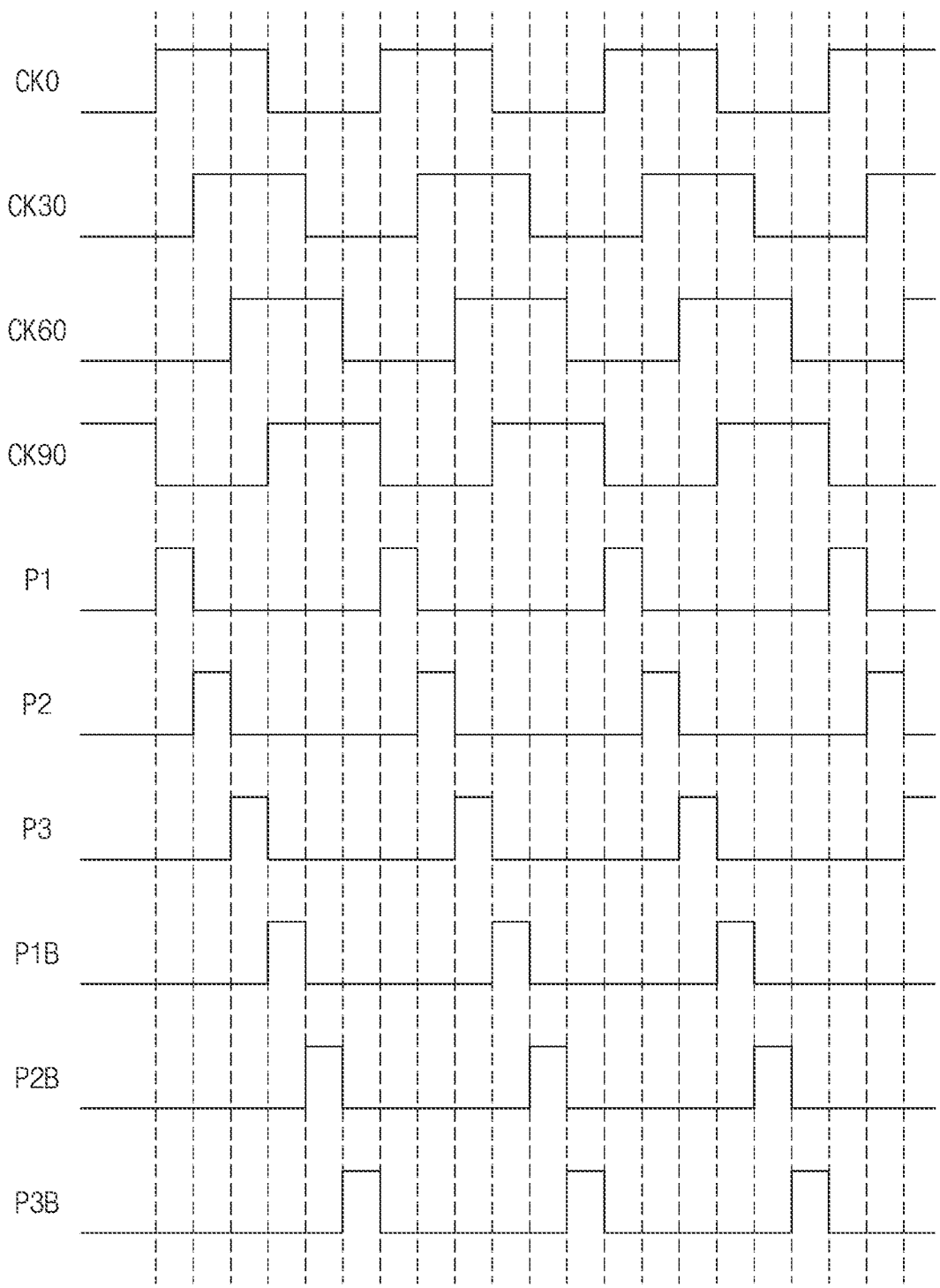
FIG. 9 is an operation timing diagram explaining an operation of first and second pulse signal generators according to an example embodiment of the inventive concepts.

FIG. 8 is a diagram showing the configuration of the first and second pulse signal generators 114-42 and 114-44 according to an example embodiment of the inventive concepts. The configuration of the second pulse signal generator 114-44 may differ from that of the first pulse signal generator 114-42 in terms of the signals that are input, the intermediate signals, and the signals that are output. Accordingly, differences in the signals of the second pulse signal generator 114-44 from the first pulse signal generator 114-42 are illustrated in parentheses in FIG. 8. Each of the first and second pulse signal generators 114-42 and 114-44 may include first to third exclusive OR (XOR) gates XOR1 to XOR3, and first to third AND gates AND1 to AND3. FIG. 9 is an operation timing diagram explaining an operation of the first and second pulse signal generators 114-42 and 114-44 according to an example embodiment of the inventive concepts.

Referring to FIGS. 8 and 9, the first XOR gate XOR1 may generate a clock signal P1(P1B) by performing an XOR operation on a clock signal CK0 and a clock signal CK30.

The second XOR gate XOR2 may generate a clock signal P2(P2B) by performing the XOR operation on the clock signal CK30 and a clock signal CK60.

The third XOR gate XOR3 may generate a clock signal P3(P3B) by performing the XOR operation on the clock signal CK60 and a clock signal CK90.

The first AND gate AND1 may generate the first pulse signal SP1 (the second pulse signal SP1B) by performing an AND operation on the clock signal P1(P1B) and the first read data do11 (the second read data do21).

The second AND gate AND2 may generate the first pulse signal SP2 (the second pulse signal SP2B) by performing the AND operation on the clock signal P2(P2B) and the first read data do12 (the second read data do22).

The third AND gate AND3 may generate the first pulse signal SP3 (the second pulse signal SP3B) by performing the AND operation on the clock signal P3(P3B) and the first read data do13 (the second read data do23).

Figure 10:
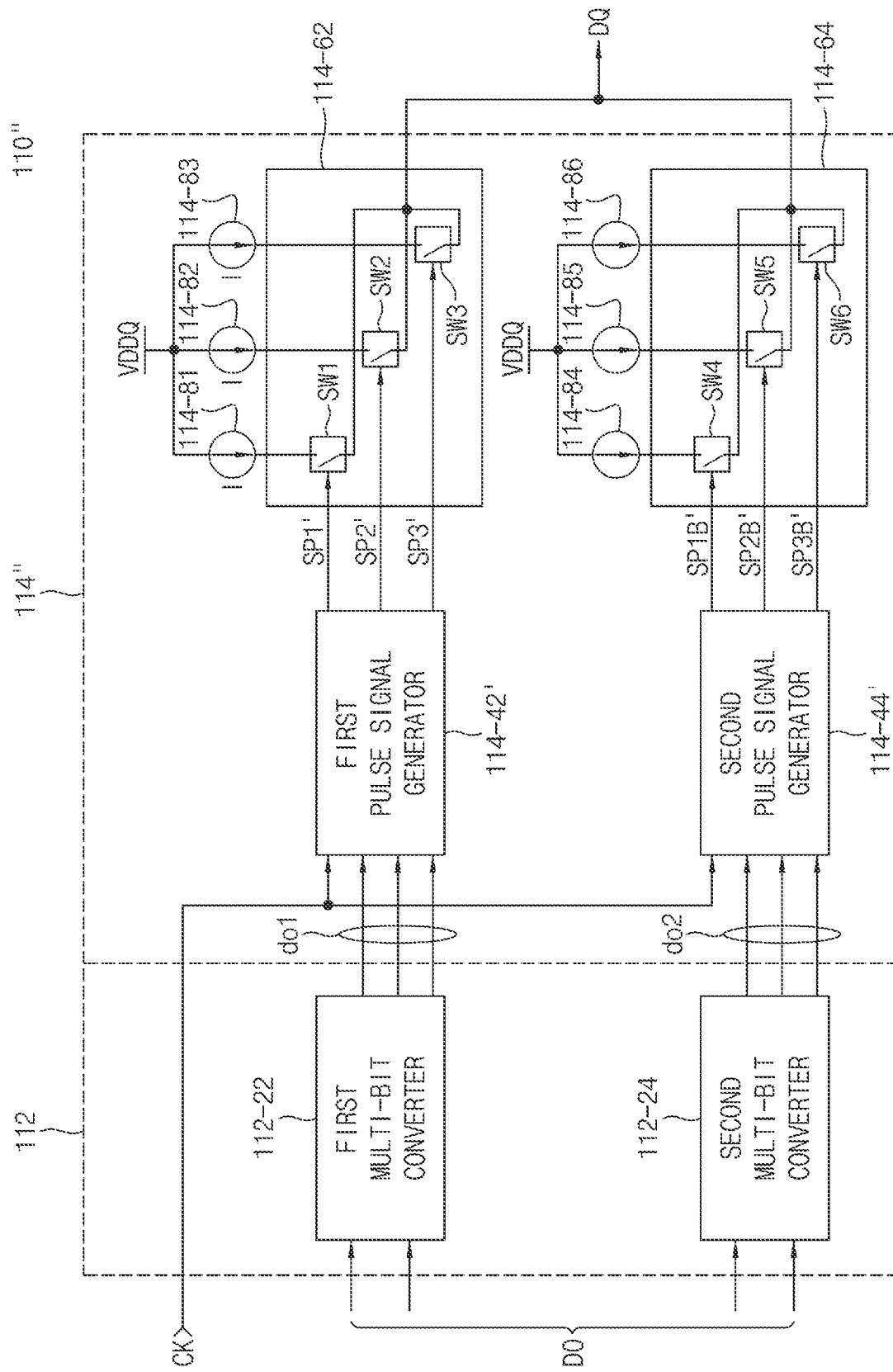
FIG. 10 is a block diagram showing a configuration of an encoder according to an example embodiment of the inventive concepts.

FIG. 10 is a block diagram showing the configuration of an encoder 110" according to an example embodiment of the inventive concepts. The encoding unit 112 may have the same configuration as the encoding unit 112 illustrated in FIG. 6, and an output driver 114" may be configured by excluding the clock signal generator 114-2 of the output driver 114' illustrated in FIG. 7 and replacing the first and second pulse signal generators 114-42 and 114-44 with first and second pulse signal generators 114-42' and 114-44'.

Functions of blocks illustrated in FIG. 10 having the same functions as the blocks illustrated in FIG. 6 or 7 may be easily understood with reference to the description of FIG. 6 or 7, and here, only functions of replaced blocks will be described.

The first pulse signal generator 114-42' may generate three first pulse signals SP1', SP2', and SP3' in response to the 3-bit first read data do1 during the activation period of the clock signal CK.

The second pulse signal generator 114-44' may generate three second pulse signals SP1B', SP2B', and SP3B' in response to the 3-bit second read data do2 during the deactivation period of the clock signal CK.

That is, the first pulse signal generator 114-42' may generate the three first pulse signals SP1', SP2', and SP3' corresponding to the number of first bits indicating a first state included in the 3-bit first read data do1. For example, when all bits of the 3-bit first read data do1 are in the first state during the activation period of the clock signal CK, all the three first pulse signals SP1', SP2', and SP3' are activated, and when 2 bits are in the first state, two of the three first pulse signals SP1', SP2', and SP3' may be activated. The second pulse signal generator 114-44' may generate the three second pulse signals SP1B', SP2B', and SP3B' corresponding to the number of second bits indicating the first state included in the 3-bit second read data do2. For example, when all bits of the 3-bit second read data do2 are in the first state during the deactivation period of the clock signal CK, all the three second pulse signals SP1B', SP2B', and SP3B' may be activated, and when 1 bit is in the first state, one signal of the three second pulse signals SP1B', SP2B', and SP3B' may be activated.

Referring to FIGS. 1, 3, and 10, the first driver 114-62 may transmit current corresponding to the number of first pulse signals which are activated among the three first pulse signals SP1', SP2', and SP3' as the data DQ during the activation period of the clock signal CK, and the second driver 114-64 may transmit current corresponding to the number of second pulse signals which are activated among the three second pulse signals SP1B', SP2B', and SP3B' as the data DQ during the deactivation period of the clock signal CK. For example, when only one first pulse signal SP1' is activated, the current I may be transmitted, and when only two second pulse signals SP1B' and SP2B' are activated, the current 2I may be transmitted. Each of the first and second drivers 114-62' and 114-64' may not transmit current or may be connected to ground voltage when the first pulse signals SP1', SP2', and SP3' and the second pulse signals SP1B', SP2B', SP3B' are not activated.

Figure 11:
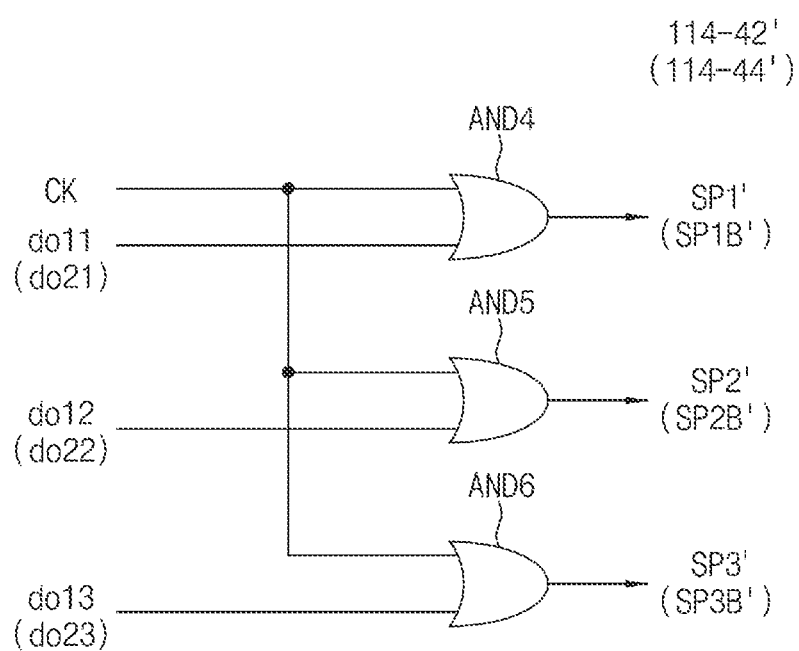
FIG. 11 is a diagram showing a configuration of first and second pulse signal generators according to an example embodiment of the inventive concepts.

FIG. 11 is a diagram showing the configuration of the first and second pulse signal generators 114-42' and 114-44' according to an example embodiment of the inventive concepts. Each of the first and second pulse signal generators 114-42' and 114-44' may include fourth to sixth AND gates AND4 to AND6.

In FIG. 11, the fourth AND gate AND4 may generate a first pulse signal SP1' (a second pulse signal SP1B') through AND of the clock signal CK (the clock signal CK or, in some embodiments, the clock signal CK90) and the first read data do11 (the second read data do21).

The fifth AND gate AND5 may generate a first pulse signal SP2' (a second pulse signal SP2B') by performing an AND operation on the clock signal CK (the clock signal CK90) and the first read data do12 (the second read data do22).

The sixth AND gate AND6 may generate a first pulse signal (SP3') (a second pulse signal SP3B') by performing the AND operation on the clock signal CK (the clock signal CK90) and the first read data do13 (the second read data do23).

That is, the clock signal CK may be generated as first pulse signals SP1', SP2', and SP3' in response to a first state of each bit of first read data do11 to do13, and the clock signal CK may be generated as second pulse signals SP1B', SP2B', and SP3B' in response to a first state of each bit of second read data do21 to do23.

Although not shown, each of the first to sixth switches SW1 to SW6 illustrated in FIGS. 6, 7, and 10 may include a plurality of MOS transistors that are connected in parallel, for example, NMOS transistors that are connected in parallel. In this case, a first state of a first pulse signal or a second pulse signal applied to each of the first to sixth switches SW1 to SW6 may have a higher voltage than the power voltage VDDQ.

Figure 12:
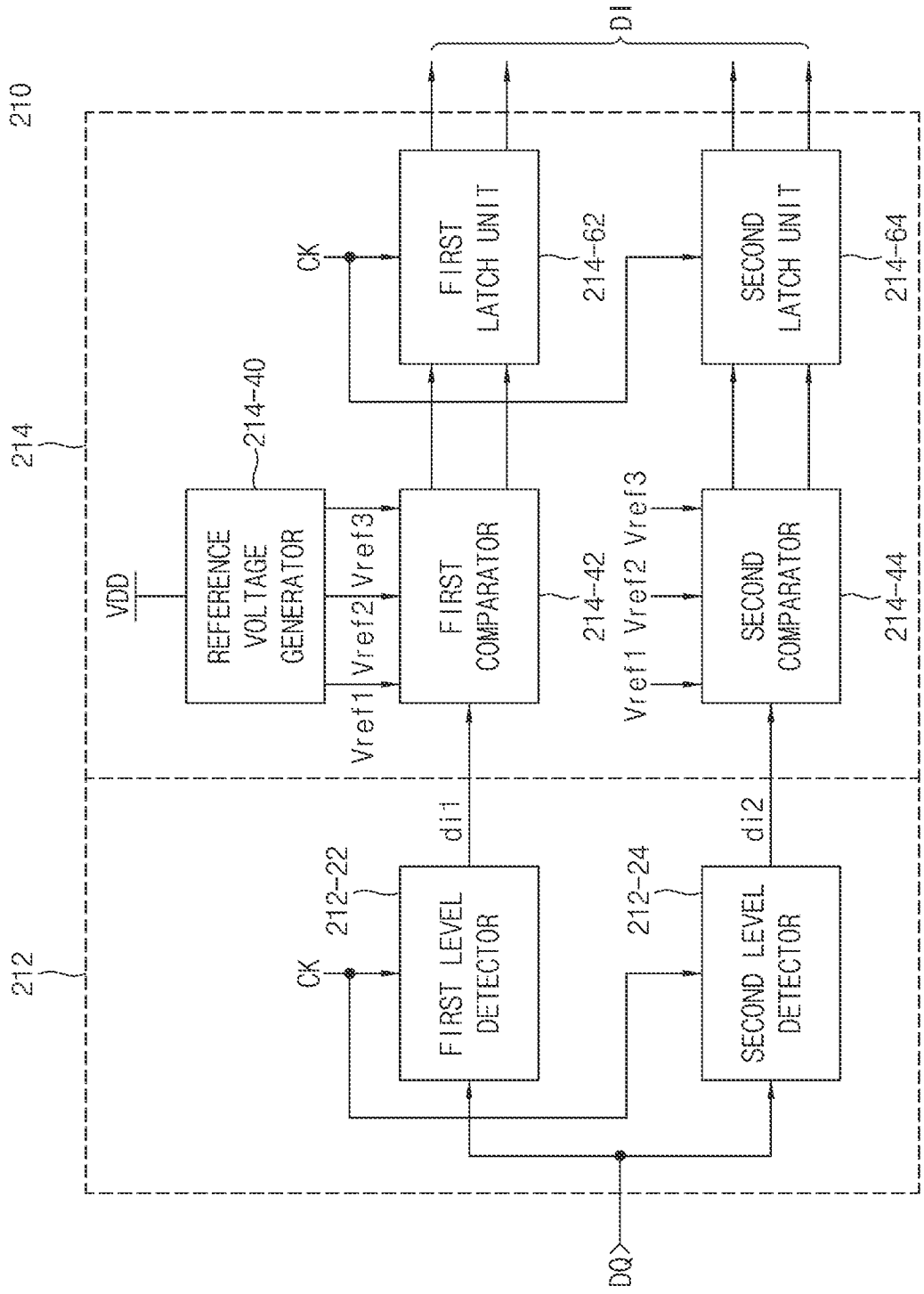
FIG. 12 is a block diagram illustrating a configuration of a decoder according to an example embodiment of the inventive concepts.

FIG. 12 is a block diagram illustrating the configuration of the decoder 210 according to an example embodiment of the inventive concepts. The input driver 212 may include a first level detector 212-22 and a second level detector 212-24, and the decoding unit 214 may include a reference voltage generator 214-40, a comparator 214-42, a second comparator 214-44, a first latch unit 214-62, and a second latch unit 214-64.

Respective functions of the blocks illustrated in FIG. 12 will be described below.

The first level detector 212-22 may detect a level generated by accumulating voltage and/or current of the data DQ during the activation period of the clock signal CK to generate the first write level di1.

The second level detector 212-24 may detect a level generated by accumulating voltage and/or current of the data DQ during the deactivation period of the clock signal CK to generate the second write level di2.

Each of the first level detector 212-22 and the second level detector 212-24 may include an integrator or a differentiator.

The reference voltage generator 214-40 may input the power voltage VDD to generate three reference voltages Vref1, Vref2, and Vref3. Here, $0<Vref1<Vref2<Vref3$ may be satisfied.

The comparator 214-42 may compare the first write level di1 with the three reference voltages Vref1, Vref2, and Vref3 to generate 2-bit first write data. The three reference voltages Vref1, Vref2, and Vref3 may correspond to an m value of 3 and the 2 bits of first write data may correspond to an n value of 2, which are examples only and not intended to limit the inventive concepts.

The second comparator 214-44 may compare the second write level di2 with the three reference voltages Vref1, Vref2, and Vref3 to generate 2-bit second write data.

Each of the first latch unit 214-62 and the second latch unit 214-64 may generate 2-bit first write data and 2-bit second write data as 4-bit write data DI in response to the clock signal CK.

Referring to FIGS. 1, 4 or 5, and 12, the first write level di1 may be detected during the activation period T1 of the clock signal CK, and whether the first write level di1 is included between two adjacent reference voltages among the three reference voltages Vref1, Vref2, and Vref3 may be determined to generate 2-bit first write data. For example, when the first write level di1 is lower than the reference voltage Vref1, first write data of "00" may be generated, when the first write level di1 is included between the reference voltage Vref1 and the reference voltage Vref2, first write data of "01" may be generated, when the first write level di1 is included between the reference voltage Vref2 and the reference voltage Vref3, first write data of "10" may be generated, and when the first write level di1 is higher than the reference voltage Vref3, first write data of "11" may be generated. Similarly, the second write level di2 may be detected during the activation period T2 of the clock signal CK to generate 2-bit second write data.

Figure 13:
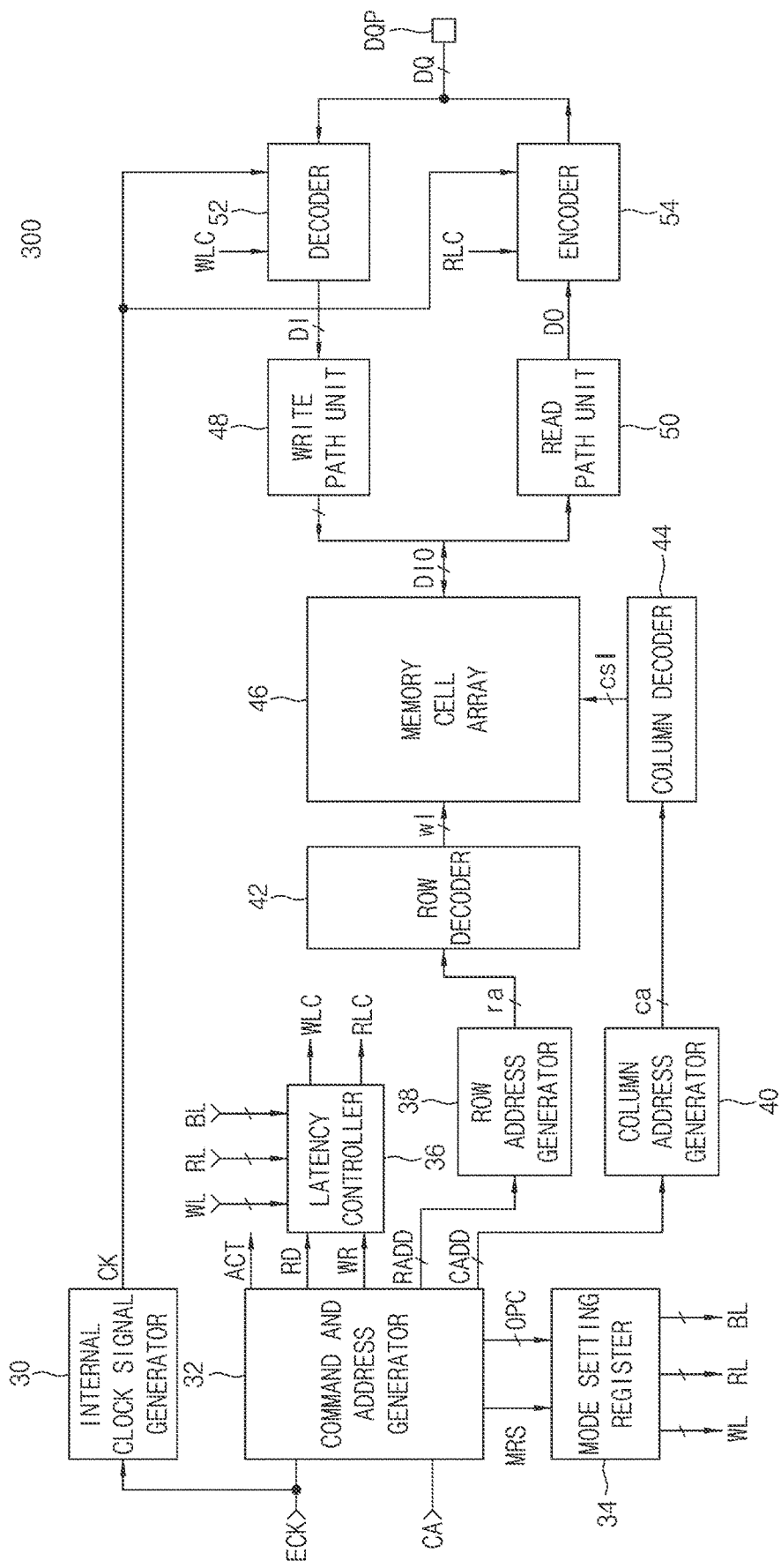
FIG. 13 is a block diagram showing the configuration of a semiconductor memory device according to an example embodiment of the inventive concepts.

FIG. 13 is a block diagram showing the configuration of a semiconductor memory device according to an example embodiment of the inventive concepts. A semiconductor memory device 300 may include an internal clock signal generator 30, a command and address generator 32, a mode setting register 34, a latency controller 36, a row address generator 38, a column address generator 40, a row decoder 42, a column decoder 44, a memory cell array 46, a write path unit 48, a read path unit 50, a decoder 52, and an encoder 54.

Respective functions of the blocks illustrated in FIG. 13 will be described below.

The internal clock signal generator 30 may receive an external clock signal ECK to generate the clock signal CK. The internal clock signal generator 30 may be a delay locked loop.

The command and address generator 32 may receive a command and address CA applied from the outside in response to the external clock signal ECK and may decode a command signal included in the command and address CA to generate a command, for example, a mode setting command MRS, an active command ACT, a write command WR, or a read command RD, and to generate an address signal included in the command and address CA as a mode setting code OPC, a row address signal RADD, or a column address signal CADD. For example, when a command signal included in the command and address CA is the mode setting command MRS, an address signal included in the command and address CA may be generated as the mode setting code OPC, when the command signal is the active command ACT, the address signal included in the command and address CA may be generated as the row address signal RADD, and when the command signal is the write command WR or the read command RD, the address signal included in the command and address CA may be generated as the column address signal CADD.

The mode setting register 34 may receive the mode setting code OPC in response to the mode setting command MRS and may set write latency WL, read latency RL, and burst length BL.

The latency controller 36 may generate a write control signal WLC in response to the write command WR and may generate a read control signal RLC in response to the read command RD. When the write command WR is generated, the latency controller 36 may generate the write control signal WLC that is activated using a value of the write latency WL and is deactivated using a value of the write latency WL and a value of the burst length BL, based on the clock signal CK. That is, the latency controller 36 may generate the write control signal WLC that is activated during a time period in which the data DQ is applied through a data terminal DQP. When the read command RD is generated, the latency controller 36 may generate the read control signal RLC, which is activated using a value of the read latency RL and is deactivated using a value of the read latency RL and a value of the burst length BL, based on the clock signal CK. That is, the latency controller 36 may generate the read control signal RLC that is activated during a time period in which the data DQ is output through the data terminal DQP.

The row address generator 38 may generate the row address signal RADD as an internal row address signal ra.

The column address generator 40 may generate the column address signal CADD as an internal column address signal ca.

The row decoder 42 may decode the row address signal ra to generate word line selection signals wl.

The column decoder 44 may decode the column address signal ca to generate column selection signals csl.

The memory cell array 46 may input and output data DIO from a plurality of memory cells selected in response to the word line selection signals wl and the column selection signals csl.

The write path unit 48 may input write data DI to generate the data DIO.

The read path unit 50 may input the data DIO to generate read data DO.

The decoder 52 may be enabled in response to the write control signal WLC and may decode the data DQ applied through the data terminal DQP to generate the write data DI. The decoder 52 may be the decoder 210 according to the example embodiments described above with reference to FIGS. 1, 4, 5, and 12.

The encoder 54 may be enabled in response to the read control signal RLC and may encode the read data DO to generate the data DQ through the data terminal DQP. The encoder 54 may be the encoder 110, 110', or 110" according to the example embodiments described above with reference to FIGS. 1 to 3, and 6 to 11.

According to the example embodiments of the inventive concepts, an encoder, a decoder, and a semiconductor memory device including the same according to example embodiments of the inventive concepts may transmit and receive many bits of data at high speed.

In addition, an encoder, a decoder, and a semiconductor memory device including the same may stably transmit and receive data even if a swing (e.g., a transition between high and low values) of transmitted and received data is small. Accordingly, an ultra-low power operation may be performed.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:
1. A semiconductor memory device comprising:
a row decoder configured to generate a plurality of word line selection signals in response to a row address;
a column decoder configured to generate a plurality of column selection signals in response to a column address;

a memory cell array comprising a plurality of memory cells, and configured to generate multi-bit read data from selected memory cells among the plurality of memory cells in response to the plurality of word line selection signals and the plurality of column selection signals and/or to store multi-bit write data from the selected memory cells;

a read path unit configured to receive the multi-bit read data and to generate 2n-bit read data during a read operation; and a decoder configured to detect, during a write operation, a first level of a current and/or a voltage received during an activation period of a clock signal an output a first write level, to detect a second level of a current and/or a voltage received during a deactivation period of the clock signal and output a second write level, to generate n-bit first write data of 2n-bit write data using the first write level, and to generate n-bit second write data of the 2n-bit write data using the second write level; and a write path unit configured to receive the n-bit first write data and the n-bit second write data to generate multi-bit write data, wherein each of the first write level and the second write level is one of at least three different levels.

2. The semiconductor memory device of claim 1, wherein the decoder comprises:

an input driver configured to detect the first level of the current and/or the voltage received during the activation period of the clock signal to output the first write level and to detect the second level of the current and/or the voltage received during the deactivation period of the clock signal to output the second write level; and a decoding unit configured to generate the n-bit first write data of the 2n-bit write data using the first write level and to generate the n-bit second write data of the 2n-bit write data using the second write level.

3. The semiconductor memory device of claim 2, wherein the input driver comprises a level detector configured to accumulate the current and/or the voltage received during the activation period of the clock signal to detect the first write level and to accumulate the current and/or the voltage received during the deactivation period of the clock signal to detect the second write level.

4. The decoder of claim 3, wherein the level detector comprises an integrator or a differentiator.

5. The semiconductor memory device of claim 4, wherein the decoding unit comprises:

a reference voltage generator configured to generate m different reference voltages;

a comparator configured to compare the first write level with the m reference voltages to generate the n-bit first write data and to compare the second write level with the m reference voltages to generate the n-bit second write data; and a latch unit configured to latch the n-bit first write data and the n-bit second write data in response to the clock signal to output 2n-bit write data.

* * * * *